(12) United States Patent
Delano

(10) Patent No.: US 6,518,849 B1
(45) Date of Patent: Feb. 11, 2003

(54) DYNAMIC DELAY COMPENSATION VERSUS AVERAGE SWITCHING FREQUENCY IN A MODULATOR LOOP AND METHODS THEREOF

(75) Inventor: Cary L. Delano, Los Altos, CA (US)

(73) Assignee: Tripath Technology, Inc., Santa Clara ( * ) Notice: Subject to any disclaimer, the term of this patent is extended or adjusted under 35 U.S.C. 154(b) by 0 days.

(21) Appl. No.: 09/836,108

(22) Filed: Apr. 16, 2001

Related U.S. Application Data

(60) Provisional application No. 60/197,487, filed on Apr. 17, 2000.
(51) Int. Cl.[7] ............... H03C 1/06; H03C 3/08; H03F 3/38
(52) U.S. Cl. ............... 332/107; 330/10; 455/126; 332/109; 332/123; 332/162
(58) Field of Search .................. 332/107, 109–111, 332/123, 159, 162; 330/10, 109; 341/128, 155; 575/238; 455/63, 126

(56) References Cited

U.S. PATENT DOCUMENTS 6,292,052 B1 * 9/2001 Carlson .................. 330/9

OTHER PUBLICATIONS

Su, David K. and Wooley, Bruce A., *A CMOS Oversampling D/A Converter with a Current–Mode Semidigital Reconstruction Filter*, Dec. 1993, IEEE Journal of Solid–State Circuits, vol. 28, No. 12, pp. 1224–1233.

* cited by examiner

*Primary Examiner*—David C. Mis
(74) *Attorney, Agent, or Firm*—Beyer Weaver & Thomas LLP

(57) ABSTRACT

The present invention monitors the average switching frequency at the output of the comparator and adjusts the delay compensation accordingly. That is, the switching frequency monitoring circuit looks at the average switching frequency and maintains the average switching frequency in a "frequency zone" which corresponds to a high elbow and a low noise floor.

17 Claims, 5 Drawing Sheets

DYNAMIC DELAY COMPENSATION VERSUS AVERAGE SWITCHING FREQUENCY IN A MODULATOR LOOP AND METHODS THEREOF

CROSS REFERENCE TO RELATED APPLICATIONS

This application takes priority under U.S.C. 119(e) from U.S. Provisional Application No. 60/197,487 entitled "Dynamic Delay Compensation Versus Average Switching Frequency" by inventor Cary Delano which filed Apr. 17, 2000 which is incorporated by reference in its entirety.

BACKGROUND

1. Field of the Invention

The present application relates to the field of oversampled, noise-shaping signal processing which includes, for example, sigma-delta modulation technology. More specifically, the present invention provides methods and apparatus for maintaining a balance between the amount of delay compensation in a modulator loop and the average switching frequency of the loop.

2. Description of the Prior Art

The THD+noise vs. Vout curve shown in FIG. 1 characterizes many modulator loops such as for example, sigma-delta modulator loops and the modulator loops described in U.S. Pat. No. 5,777,512 for METHOD AND APPARATUS FOR OVERSAMPLED, NOISE-SHAPING, MIXED-SIGNAL PROCESSING issued on Jul. 7, 1998, the entire disclosure of which is incorporated herein by reference for all purposes. The position of the "elbow" or "knee" 100 of the curve, i.e., the point at which the slope of the curve increases dramatically, is, in part, a function of the amount of delay in the feedback loop of the modulator. That is, the greater the amount of delay in the loop, the further to the right the elbow moves.

U.S. Pat. No. 5,909,153 for METHOD AND APPARATUS FOR COMPENSATING FOR DELAYS IN MODULATOR LOOPS issued on Jun. 1, 1999, the entire disclosure of which is incorporated herein by reference for all purposes, describes a technique by which feedback from the output of the comparator is introduced at various points in the loops integrator stages. These delay compensation technique also have the effect of moving elbow 100 to the right. In that application, an estimate of the loop delay is made and a fixed amount of compensation feedback which corresponds to the estimate is provided.

However, if the elbow if pushed too far out, distortion is introduced in the band of interest and the THD+noise floor goes up. This may be caused, for example, by the fact that some of the feedback information is getting into the band of interest or that the feedback causes the loop to behave in a way which doesn't model the original transfer function ideally. That is, because there are a number of nonlinearities in the loop, if the loop behavior and/or the average switching frequency is modified, the distortion characteristics of the various loop elements are commensurably modified which ultimately introduces more distortion.

Thus, what is desired is an optimal delay compensation since as the amount of delay in the loop is increased, more compensation is needed which, in turn, adversely affects the linearity of the circuit.

SUMMARY OF THE INVENTION

The present invention monitors the average switching frequency at the output of the comparator and adjusts the delay compensation accordingly. That is, the switching frequency monitoring circuit looks at the average switching frequency and maintains the average switching frequency in a "frequency zone" which corresponds to a high elbow and a low noise floor.

In one embodiment, an apparatus for providing a loop delay to a modulator loop circuit is disclosed. The apparatus includes a switching frequency monitoring circuit coupled to the loop circuit arranged to determine a current switching frequency of the loop circuit, and to generate control signals based upon the current switching frequency. A delay compensation circuit is coupled to the loop circuit and the switching frequency monitoring circuit arranged to provide the loop delay to the loop circuit based upon the control signals so as to maintain a balance between an amount of delay compensation in the loop circuit and an average switching frequency of the loop circuit.

In another embodiment, a method of providing a loop delay to a modulator loop circuit. The method is carried out by determining a current switching frequency of the loop circuit, generating control signals based upon the current switching frequency, and providing the loop delay to the loop circuit based upon the control signals so as to maintain a balance between an amount of delay compensation in the loop circuit and an average switching frequency of the loop circuit.

BRIEF DESCRIPTION OF THE DRAWINGS

The invention may best be understood by reference to the following description taken in conjunction with the accompanying drawings.

DETAILED DESCRIPTION OF THE EMBODIMENTS

In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the invention.

In the described embodiment, the present invention monitors the average switching frequency at the output of the comparator and adjusts the delay compensation accordingly. That is, the switching frequency monitoring circuit looks at the average switching frequency and maintains the average switching frequency in a "frequency zone" which corresponds to a high elbow and a low noise floor.

Figure 1:
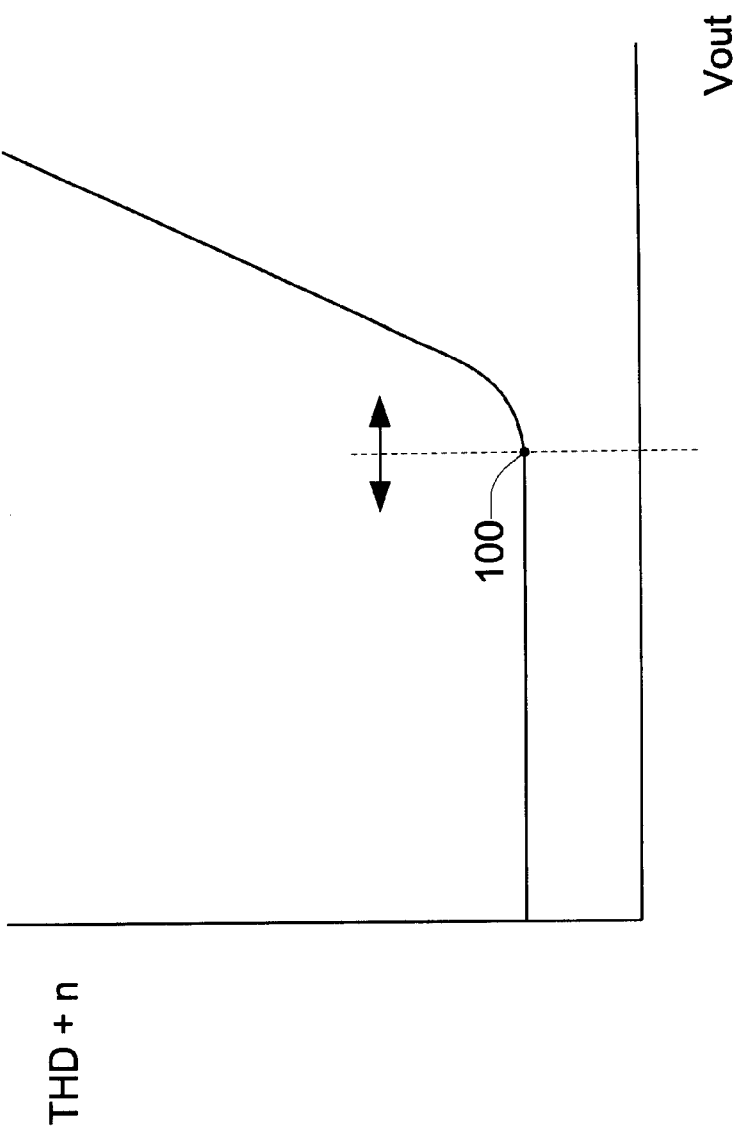
FIG. 1 shows an exemplary THD+noise vs. Vout curve.
Figure 2A:
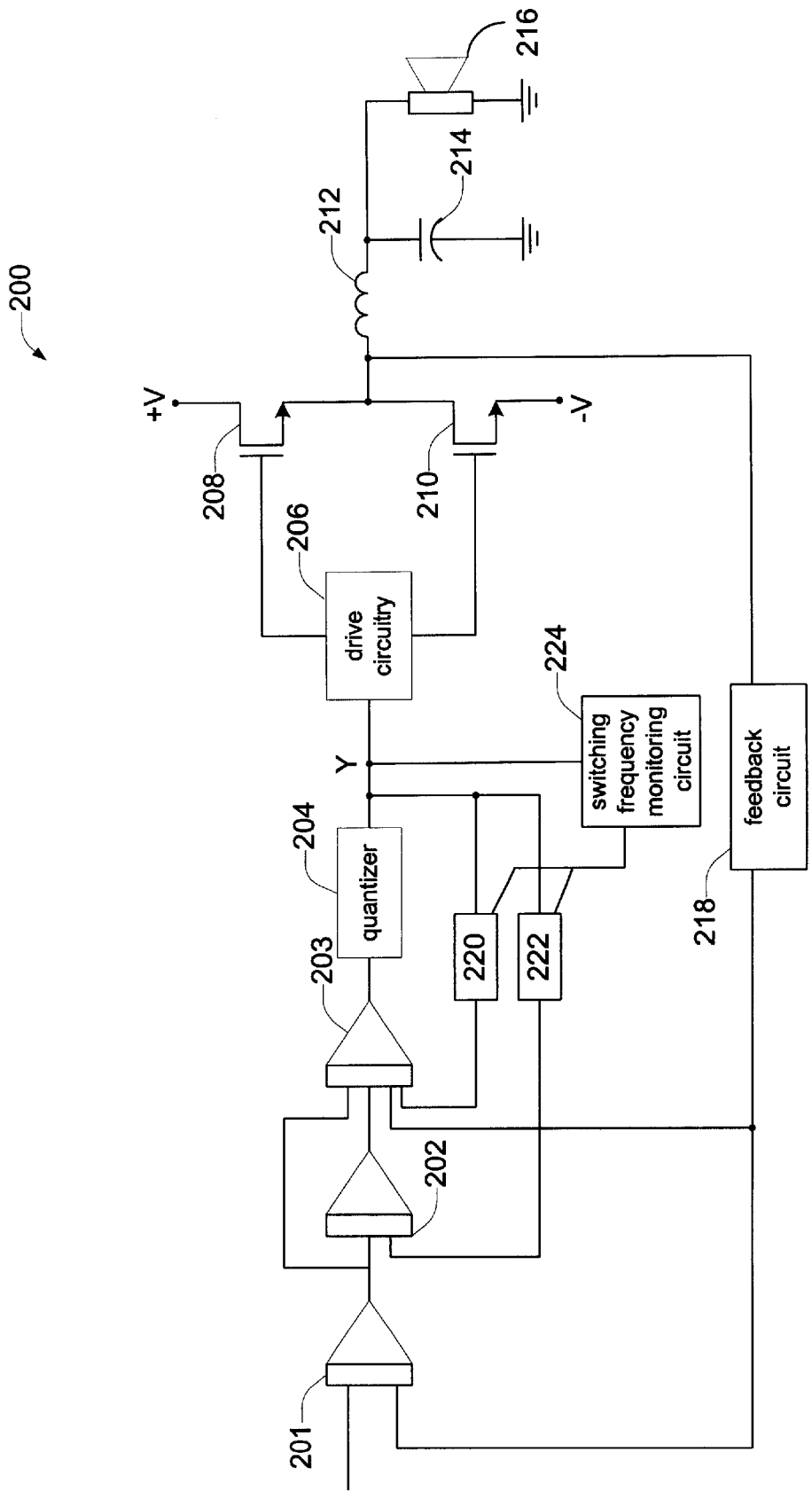
FIGS. 2A–2C show a simplified schematic diagram of an oversampled, noise-shaping modulator designed according to the present invention.

FIG. 2A is a simplified schematic diagram of an oversampled, noise-shaping modulator 200 designed according to the present invention. An analog input signal is noise-shaped by a third-order frequency selective network comprising three integrator stages 201, 202, and 203. A quantizer 204, e.g., a comparator or a ADC converts the noise-shaped signal to a digital signal from which drive signals are generated by drive circuitry 206 for driving the FETs 208 and 210 of the power stage. The output of the power stage is filtered by inductor 212 and capacitor 214 and used to drive load 216. The amplifier configuration shown in FIG. 2A is an audio amplifier, although it will be understood that the present invention applies to a wide variety of amplifier configurations and signal bands, e.g., RF bandpass applications.

According to the described embodiment, feedback is provided from the output of the power stage to various ones of the integrator stages via feedback circuitry 218. This feedback may be continuous-time feedback as described in U.S. Pat. No. 5,777,512 incorporated by reference above, or via a DAC as with standard sigma delta modulation techniques. Feedback is also provided from the output of quantizer 204 (i.e., signal node Y) to various ones of the integrator stages via delay compensation elements 220 and 222 for the purpose of compensating for loop delays in a manner similar to that described in U.S. Pat. No. 5,909,153 incorporated by reference above.

According to the present invention, switching frequency monitoring circuit 224 also receives input from the output of quantizer 204 for determining the current switching frequency and then generating control signals which adjusts delay compensation elements 220 and 222 accordingly to maintain an advantageous loop delay and switching frequency.

Figure 2B:
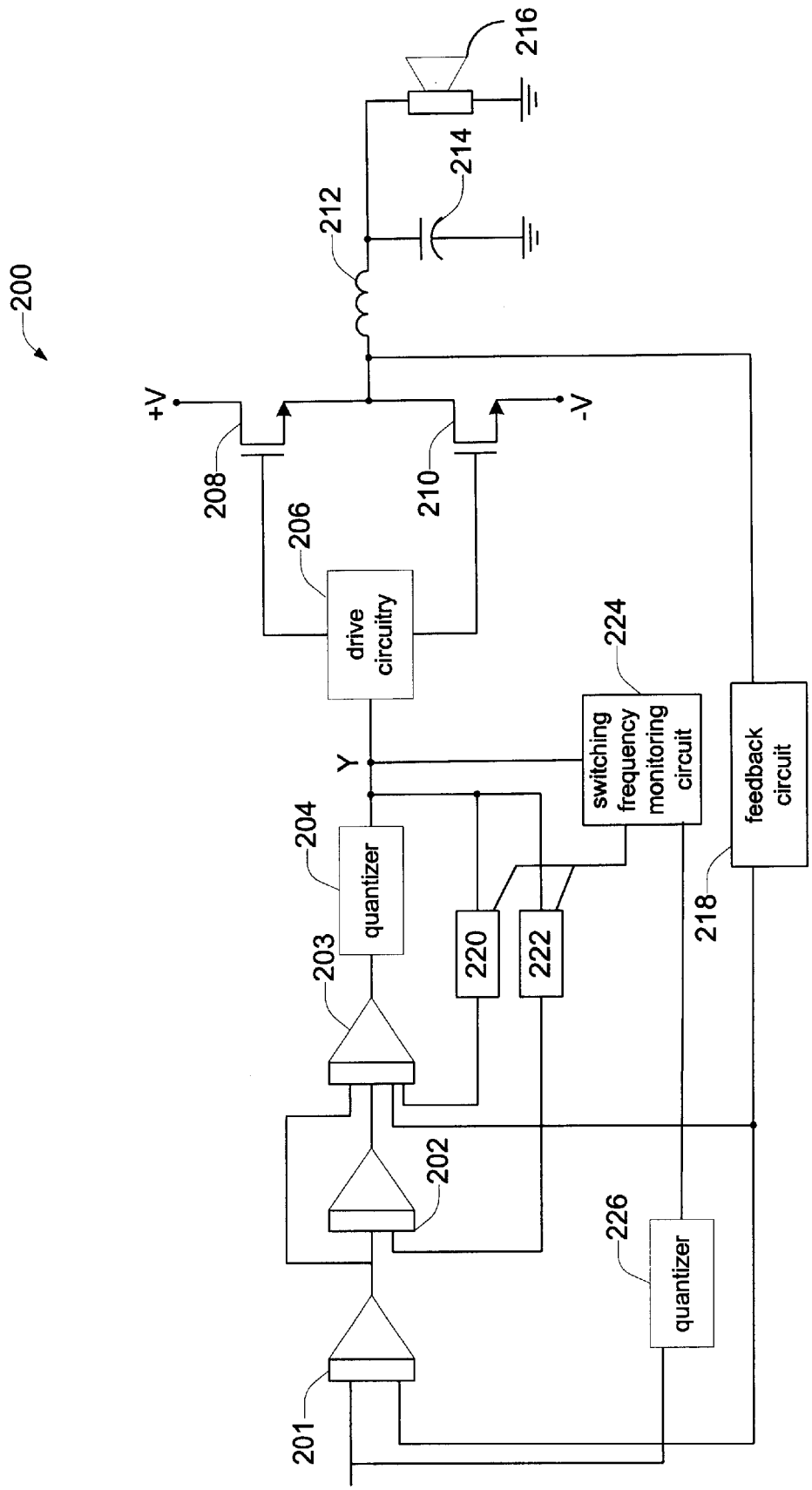

At lower signal levels, the switching frequency is lower and there is less of a need for delay compensation. Therefore, according to a specific embodiment of the invention shown in FIG. 2B, an intelligent implementation is provided such that the delay compensation is only introduced when the signal level reaches some threshold. This may be done, for example, by looking at the input signal through a quantizer 226 and providing the digitized signal level information to the switching frequency monitoring circuit 224 which uses the information to determine when to adjust delay compensation elements 220 and 222. Thus, at lower signal levels, the circuit is allowed to switch at lower frequencies (and thus at a higher efficiency). When the signal levels get high enough to where the THD+n elbow is being approached, the frequency of the loop may be adjusted by adjusting the compensation feedback, thereby allowing the circuit to handle more delay.

Figure 2C:
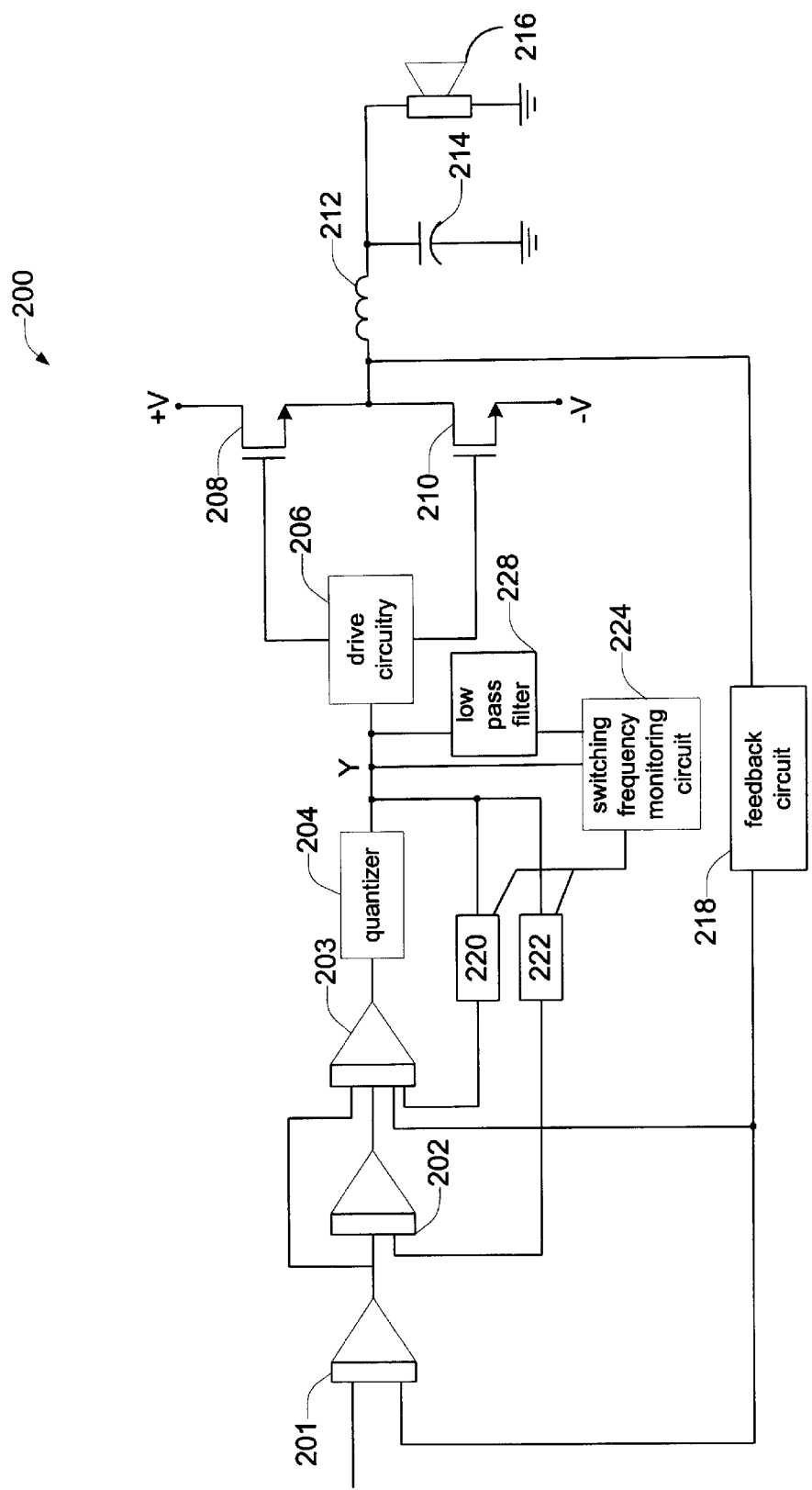

According to another embodiment shown in FIG. 2C, the signal level information is determined by looking at the digital data to determine what the input signal level is. This has the advantage that it is already a digital signal and therefore quantizer 226 is not necessary, although some low pass filtering, e.g., low pass filter 228, may be included.

According to another embodiment, the signal level information may also be used to adjust the loop delay to maintain the switching frequency in the desired zone. That is, the signal level information from, for example, quantizer 226 of FIG. 2B or low pass filter 228 of FIG. 2C may be used in combination with a technique described in copending U.S. Provisional Application No. 60/146,449 for DYNAMIC SWITCHING FREQUENCY CONTROL METHOD FOR A DIGITAL SWITCHING POWER AMPLIFIER filed on Jul. 29, 1999, the entire disclosure of which is incorporated herein by reference for all purposes, to dynamically control the amount of delay in the modulator feedback loop and therefore the average switching frequency of the loop. This may be done by using the signal level information to control a dynamic delay line (not shown) in, for example, drive circuitry 206. In addition, because the delay handling capability of such techniques has limits, delay compensation eventually might need to be introduced. Thus, this technique may be employed in combination with the techniques described above.

Figure 3:
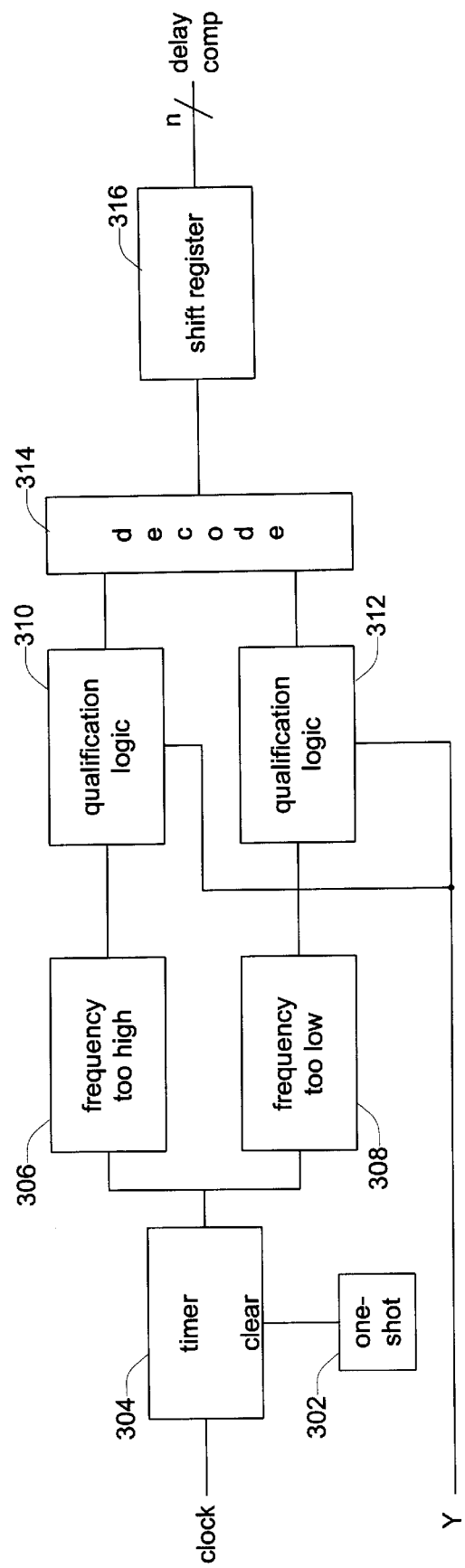
FIG. 3 shows a specific embodiment of a switching frequency monitoring circuit designed according to the present invention.

A specific embodiment of a switching frequency monitoring circuit 224 designed according to the present invention is shown in FIG. 3. Each transition at signal node Y activates one-shot 302 and clears timer 304. The output of timer 304 is provided to two signal paths, one which determines whether the switching frequency exceeds the upper bound of the desired frequency zone, and one which determines whether it is lower than the lower bound of the desired frequency zone. Decoder blocks 306 and 308 decode the timer output accordingly to get frequency information (i.e., 1/t) and feed the frequency information to qualification logic blocks 310 and 312 which may be, for example, a string of D flip-flops. If either qualification logic block sees some consecutive number of pulses (e.g., 4 or 5) indicating the frequency is either too high or too low an appropriate signal is generated which eventually results in adjustment of the delay compensation elements. That is, the qualification logic output is decoded (decode block 314) which, when a high or low frequency condition is indicated, generates a shift left/shift right control signal which is input to an n-bit shift register 316, the output of which is used to adjust the delay compensation elements accordingly.

While the invention has been particularly shown and described with reference to specific embodiments thereof, it will be understood by those skilled in the art that changes in the form and details of the disclosed embodiments may be made without departing from the spirit or scope of the invention.

What is claimed is:

1. An apparatus for providing a loop delay to a modulator loop circuit, comprising:
   a switching frequency monitoring circuit coupled to the loop circuit arranged to, determine a current switching frequency of the loop circuit, and generate control signals based upon the current switching frequency;
   a delay compensation circuit coupled to the loop circuit and the switching frequency monitoring circuit arranged to provide the loop delay to the loop circuit based upon the control signals so as to maintain a balance between an amount of delay compensation in the loop circuit and an average switching frequency of the loop circuit.

2. An apparatus as recited in claim 1, wherein the loop delay is provided when an input signal level of an input signal at a loop input node is greater than a first threshold level.

3. An apparatus as recited in claim 2, further comprising:
   a quantizer coupling the loop input node to the switching frequency monitoring circuit.

4. An apparatus as recited in claim 3, wherein the quantizer provides a digitized input signal to the switching frequency monitoring circuit.

5. An apparatus as recited in claim 4, wherein the switching frequency monitoring circuit uses the digitized input signal to adjust the control signals.

6. An apparatus as recited in claim 1, wherein the switching frequency monitoring circuit comprises:
   a timer circuit;
   a one-shot circuit coupled to the timer circuit;
   a switching frequency comparator circuit coupled to an output of the timer circuit arranged to determine if the switching frequency exceeds an upper bound of a desired frequency band and if the switching frequency is lower than a lower bound of the desired frequency band and to provide at an output node, a first output signal when the upper bound is exceeded and a second output signal when the lower bound is not reached, respectively; and a qualification circuit coupled to the output node of the switching frequency comparator unit arranged to provide the control signals based upon a number of consecutive pulses at the output node.

7. A method of providing a loop delay to a modulator loop circuit, comprising:

determining a current switching frequency of the loop circuit;

generating control signals based upon the current switching frequency;

providing the loop delay to the loop circuit based upon the control signals so as to maintain a balance between an amount of delay compensation in the loop circuit and an average switching frequency of the loop circuit.

8. A method as recited in claim 7, wherein the loop delay is provided when an input signal level of an input signal at a loop input node is greater than a first threshold level.

9. A method as recited in claim 7, wherein the loop circuit further comprises a quantizer coupling the loop input node to the switching frequency monitoring circuit.

10. A method as recited in claim 9, wherein the quantizer provides a digitized input signal to the switching frequency monitoring circuit.

11. A method as recited in claim 10, wherein the switching frequency monitoring circuit uses the digitized input signal to adjust the control signals.

12. An method of providing a loop delay to a modulator loop circuit, comprising:

providing a switching frequency monitoring circuit coupled to the loop circuit arranged to determine a current switching frequency of the loop circuit, and generate control signals based upon the current switching frequency; and providing a delay compensation circuit coupled to the loop circuit and the switching frequency monitoring circuit arranged to provide the loop delay to the loop circuit based upon the control signals so as to maintain a balance between an amount of delay compensation in the loop circuit and an average switching frequency of the loop circuit.

13. A method as recited in claim 12, wherein the loop delay is provided when an input signal level of an input signal at a loop input node is greater than a first threshold level.

14. A method as recited in claim 13, further comprising:

providing a quantizer coupling the loop input node to the switching frequency monitoring circuit.

15. A method as recited in claim 14, wherein the quantizer provides a digitized input signal to the switching frequency monitoring circuit.

16. A method as recited in claim 15, wherein the switching frequency monitoring circuit uses the digitized input signal to adjust the control signals.

17. A method as recited in claim 12, further comprising:

providing a timer circuit;

providing a one-shot circuit coupled to the timer circuit;

providing a switching frequency comparator circuit coupled to an output of the timer circuit arranged to determine if the switching frequency exceeds an upper bound of a desired frequency band and if the switching frequency is lower than a lower bound of the desired frequency band and to provide at an output node, a first output signal when the upper bound is exceeded and a second output signal when the lower bound is not reached, respectively; and providing a qualification circuit coupled to the output node of the switching frequency comparator unit arranged to provide the control signals based upon a number of consecutive pulses at the output node.

* * * * *